(12) United States Patent
Quinones et al.

(10) Patent No.: US 7,196,313 B2
(45) Date of Patent: Mar. 27, 2007

(54) SURFACE MOUNT MULTI-CHANNEL OPTOCOUPLER

(75) Inventors: Maria Clemens Y. Quinones, Cebu (PH); Rajeev Joshi, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 127 days.

(21) Appl. No.: 10/817,195

(22) Filed: Apr. 2, 2004

(65) Prior Publication Data

US 2005/0218300 A1    Oct. 6, 2005

(51) Int. Cl.
*H01L 31/00* (2006.01)
*G02B 27/00* (2006.01)
(52) U.S. Cl. ............... 250/214.1; 250/551; 257/80
(58) Field of Classification Search ......... 250/214.1, 250/239, 551; 257/80–82, 723, 738, 783, 257/790
See application file for complete search history.

(56) References Cited

U.S. PATENT DOCUMENTS

| | | | |
|---|---|---|---|
| 4,114,177 A * | 9/1978 | King | 257/81 |
| 4,124,860 A * | 11/1978 | Johnson | 257/82 |
| 4,445,043 A | 4/1984 | Hill | |
| 4,450,461 A | 5/1984 | Cook et al. | |
| 4,680,613 A | 7/1987 | Daniels | |
| 4,720,396 A | 1/1988 | Wood | |
| 4,731,701 A | 3/1988 | Kuo et al. | |
| 4,751,199 A | 6/1988 | Phy | |
| 4,769,709 A | 9/1988 | Van De Steeg | |
| 4,772,935 A | 9/1988 | Lawler et al. | |
| 4,791,473 A | 12/1988 | Phy | |
| 4,794,431 A * | 12/1988 | Park | 257/82 |
| 4,857,746 A | 8/1989 | Kuhlmann et al. | |
| 4,890,153 A | 12/1989 | Wu | |
| 5,172,214 A | 12/1992 | Casto | |
| 5,203,075 A | 4/1993 | Angulas et al. | |
| 5,450,283 A | 9/1995 | Lin et al. | |
| 5,537,075 A | 7/1996 | Miyazaki | |
| 5,545,893 A | 8/1996 | Brown et al. | |
| 5,637,916 A | 6/1997 | Joshi | |
| 5,677,245 A | 10/1997 | Brown et al. | |
| 5,729,437 A | 3/1998 | Hashimoto | |
| 5,765,280 A | 6/1998 | Joshi | |
| 5,777,386 A | 7/1998 | Higashi et al. | |
| 5,789,809 A | 8/1998 | Joshi | |
| 6,133,634 A | 10/2000 | Joshi | |

(Continued)

OTHER PUBLICATIONS

Technical Literature from NEC/California Eastern Laboratories, Inc., NEC Quad Optocoupler in 16-Pin SSOP Package, PS28XX-4 Family, unknown date, 1 page total.

(Continued)

*Primary Examiner*—Stephone B. Allen
*Assistant Examiner*—Patrick J. Lee
(74) *Attorney, Agent, or Firm*—Townsend and Townsend and Crew LLP

(57) ABSTRACT

An optocoupler package is disclosed. The optocoupler package includes a substrate comprising a leadframe and a molding compound, and a plurality of optocouplers, each optocoupler including (i) an optical emitter, (ii) an optical receiver, (iii) and an optically transmissive medium disposed between the optical emitter and optical receiver, where the optical emitter and the optical receiver are electrically coupled to the leadframe.

27 Claims, 7 Drawing Sheets

U.S. PATENT DOCUMENTS

| | | | |
|---|---|---|---|
| 6,143,981 A | 11/2000 | Glenn | |
| 6,229,200 B1 | 5/2001 | Mclellan et al. | |
| 6,242,281 B1 | 6/2001 | Mclellan et al. | |
| 6,294,403 B1 | 9/2001 | Joshi | |
| 6,307,272 B1 | 10/2001 | Takahashi et al. | |
| 6,324,072 B1 * | 11/2001 | Lorenz et al. | 361/803 |
| 6,342,670 B1 * | 1/2002 | Lin et al. | 136/251 |
| 6,384,472 B1 | 5/2002 | Huang | |
| 6,393,183 B1 | 5/2002 | Worley | |
| 6,424,035 B1 | 7/2002 | Sapp et al. | |
| 6,433,277 B1 | 8/2002 | Glenn | |
| 6,437,429 B1 | 8/2002 | Su et al. | |
| 6,449,174 B1 | 9/2002 | Elbanhawy | |
| 6,469,384 B2 | 10/2002 | Joshi | |
| 6,479,888 B1 | 11/2002 | Hirashima et al. | |
| 6,489,678 B1 | 12/2002 | Joshi | |
| 6,518,653 B1 | 2/2003 | Takagi | |
| 6,528,869 B1 | 3/2003 | Joshi | |
| 6,556,750 B2 | 4/2003 | Constantino et al. | |
| 6,566,749 B1 | 5/2003 | Joshi et al. | |
| 6,603,183 B1 * | 8/2003 | Hoffman | 257/434 |
| 6,627,991 B1 | 9/2003 | Joshi | |
| 6,633,030 B2 | 10/2003 | Joshi | |
| 6,642,738 B2 | 11/2003 | Elbanhawy | |
| 6,645,791 B2 | 11/2003 | Noquil et al. | |
| 6,661,082 B1 | 12/2003 | Granada et al. | |
| 6,674,157 B2 | 1/2004 | Lang | |
| 6,683,375 B2 | 1/2004 | Joshi et al. | |
| 6,696,321 B2 | 2/2004 | Joshi | |
| 6,720,642 B1 | 4/2004 | Joshi et al. | |
| 6,731,003 B2 | 5/2004 | Joshi et al. | |
| 6,740,541 B2 | 5/2004 | Rajeev | |
| 6,753,605 B2 | 6/2004 | Joshi | |
| 6,777,800 B2 | 8/2004 | Madrid et al. | |
| 6,784,376 B1 | 8/2004 | Huemoeller et al. | |
| 6,798,044 B2 | 9/2004 | Joshi | |
| 6,798,047 B1 | 9/2004 | Miks et al. | |
| 6,806,580 B2 | 10/2004 | Joshi et al. | |
| 6,818,973 B1 | 11/2004 | Foster | |
| 6,830,959 B2 | 12/2004 | Estacio | |
| 6,836,023 B2 | 12/2004 | Joshi et al. | |
| 6,867,481 B2 | 3/2005 | Joshi et al. | |
| 6,867,489 B1 | 3/2005 | Estacio | |
| 6,891,256 B2 | 5/2005 | Joshi et al. | |
| 6,891,257 B2 | 5/2005 | Chong et al. | |
| 6,893,901 B2 | 5/2005 | Madrid | |
| 6,943,434 B2 | 9/2005 | Tangpuz et al. | |
| 6,949,410 B2 | 9/2005 | Joshi et al. | |
| 6,953,998 B2 | 10/2005 | Joshi | |
| 6,989,588 B2 | 1/2006 | Quinones et al. | |
| 6,992,384 B2 | 1/2006 | Joshi | |
| 7,008,868 B2 | 3/2006 | Joshi | |
| 7,022,548 B2 | 4/2006 | Joshi et al. | |
| 7,023,077 B2 | 4/2006 | Madrid | |
| 7,029,947 B2 | 4/2006 | Joshi | |
| 7,061,077 B2 | 6/2006 | Joshi | |
| 7,081,666 B2 | 7/2006 | Joshi et al. | |
| 7,101,734 B2 | 9/2006 | Granada et al. | |
| 2002/0068950 A1 | 6/2002 | Joshi | |
| 2002/0068959 A1 | 6/2002 | Joshi | |
| 2002/0084511 A1 | 7/2002 | Konishi | |
| 2002/0093094 A1 | 7/2002 | Takagawa et al. | |
| 2002/0100962 A1 | 8/2002 | Joshi | |
| 2002/0163070 A1 | 11/2002 | Choi | |
| 2002/0167075 A1 | 11/2002 | Madrid | |
| 2003/0148508 A1 | 8/2003 | Chen et al. | |
| 2004/0173894 A1 | 9/2004 | Glenn et al. | |

OTHER PUBLICATIONS

U.S. Appl. No. 11/180,367, Joshi.
U.S. Appl. No. 10/841,656, Joshi et al.

* cited by examiner

SURFACE MOUNT MULTI-CHANNEL OPTOCOUPLER

BACKGROUND OF THE INVENTION

Optocouplers contain at least one optical emitter device which is optically coupled to an optical receiver device through an optically transmissive medium. This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is important because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit.

A common optocoupler package format is the dual-in-line package or DIP. This package is widely used to house integrated circuits and is also used for conventional optocouplers. Various versions of optocoupler DIP packages having 4, 6, 8 or 16 pins are commonly manufactured.

FIG. 1 shows a cross section of a conventional optocoupler DIP package 10. The illustrated optocoupler 10 includes a lead frame 24 comprising leads 24(a), 24(b) (i.e., pins). An optical emitter device 12 is mounted on one lead 24(a). An optical receiver device 14 is mounted on the other lead 24(b). The optical receiver device 14 generates an electrical signal after receiving light generated by the optical emitter device 12. The optical emitter device 12 is electrically coupled to the lead 24(a) through its bottom surface, and to another lead (not shown) via a wire 11. Similarly, optical receiver device 14 is electrically coupled to the lead 24(b) through the bottom surface and to another lead (not shown) via a wire 13. It will be recognized by those skilled in the art that the optical emitter device 12 operates with two electrical connections, an anode and a cathode. These connections are thus provided by the wire 11 and the lead 24(a). Similarly, optical receiver device 14 operates with two electrical connections, typically an emitter and a collector. These connections are provided by the wire 13 and lead 24(b). The optocoupler package 10 further includes an optically transmissive medium 16. A molding compound 18 encases the leadframe 24, optical emitter device 12, optical receiver device 14, and the optically transmissive medium 16.

A number of improvements could be made to the optocoupler package 10 shown in FIG. 1. For example, the optocoupler package 10 requires an expensive and time consuming overmolding process. In the overmolding process, the molding compound 18 encapsulates the other parts of the optocoupler package 10. In addition to the overmolding process itself, mold material removal processes (e.g., dejunk and deflash processes) are used to remove excess molding compound, thus adding to the time and expense of forming an optocoupler package. In addition, the tooling that is needed to create moldings of different "form factors" (e.g., 4, 6, or 8 pin packages) requires a significant capital investment. Accordingly, if the overmolding process could be eliminated, the time and costs associated with producing optocoupler packages could be reduced.

Other improvements to the optocoupler package 10 could also be made. The optocoupler package 10 is also prone to failure from thermal cycling. For example, the difference in the thermal expansion properties of the molding compound 18 and the optically transmissive medium 16 causes them to expand and contract at different rates when they are heated and cooled. The molding compound 18 and the optically transmissive medium 16 could potentially separate, thus resulting in a structurally weak package. Temperature cycling also produces stress at the points where the lead frame 24 exits the molding compound 18 (e.g., at point "A"). The stress can result in a broken or weakened lead frame 24. Also, the wires 11, 13 can sometimes pass through the optically transmissive medium 16 and the molding compound 18. Differences in the thermal expansion properties of the optically transmissive medium 16 and the molding compound 18 can induce stress in the wires 11, 13 and can cause them to break.

It would also be desirable to reduce the height of conventional optocoupler packages. The optocoupler package 10 shown in FIG. 1 is relatively high. For example, the net height of a typical DIP package is about 3.5 to about 4.0 mm. It would be desirable to reduce the height of the optocoupler package so that it has a lower profile. By doing so, smaller electronic components could be produced.

It would also be desirable to increase the functionality of the above-described package and also to reduce the costs associated with manufacturing the optocoupler package.

Embodiments of the invention address these and other problems, individually and collectively.

SUMMARY OF THE INVENTION

Embodiments of the invention are directed to optocoupler packages and methods for making the same.

One embodiment of the invention is directed to an optocoupler package comprising: (a) a substrate comprising a leadframe and a molding compound; (b) an optical emitter; (c) an optical receiver, wherein the optical emitter and the optical receiver are electrically coupled to the leadframe; and (d) an optically transmissive medium disposed between the optical emitter and optical receiver.

Another embodiment of the invention is directed to a method for forming an optocoupler package comprising: (a) forming a substrate comprising a leadframe and a molding compound; (b) attaching an optical emitter and an optical receiver to the substrate; and (c) depositing a light transmissive material between the optical emitter and the optical receiver.

Another embodiment of the invention is directed to an optocoupler package comprising: (a) a substrate; (b) at least two optical emitters; (c) at least two optical receivers; and (d) optically transmissive media between adjacent optical emitters and optical receivers, wherein the optical emitters and the optical receivers are on the substrate.

These and other embodiments are described in further detail below.

DETAILED DESCRIPTION

In embodiments of the invention, one or more optocouplers are on a single substrate that is formed from a leadframe and a molding compound. For example, there can be four optocouplers in a quad array on a single substrate. Each optocoupler can include an optical emitter (e.g., a light emitting diode) and an optical receiver (e.g., a photodiode). The spacing between the optical receiver and the optical emitter can be from about 0.3 mm to about 0.5 mm. Each optocoupler can be secured with an optically transmissive coupling gel and can be encapsulated with an opaque, highly reflective epoxy based polymer. The functional terminals for the optocouplers can be grouped and routed towards the periphery of the package so that a ball grid array layout is formed. The optical receivers, the optical emitters, and wire bond pads are arranged so that they will correspond to the terminals of the leadframe.

Logic devices such as control chips can also be on the leadframe-based substrate and may also be in the optocoupler package. Also, chips including MOSFETs (metal oxide semiconductor field effect transistors) such as power MOSFETs with or without trenched gates may be on the substrate and in the package. Such chips or devices may be on the substrate and may be electrically coupled to components such as optical emitters and optical receivers.

In some embodiments, the optocoupler package is a thin and has at least two optocouplers (e.g., four optocouplers). Advantageously, a single optocoupler package can provide the same or improved performance as compared to four stand-alone optocoupler packages with one optocoupler each. As will be shown below, the peripheral solder ball layout in the package allows for a simpler board design, because the routings of the conductive traces are already integrated into the optocoupler package. This also saves space on the board to which the optocoupler package is attached.

Figure 1:
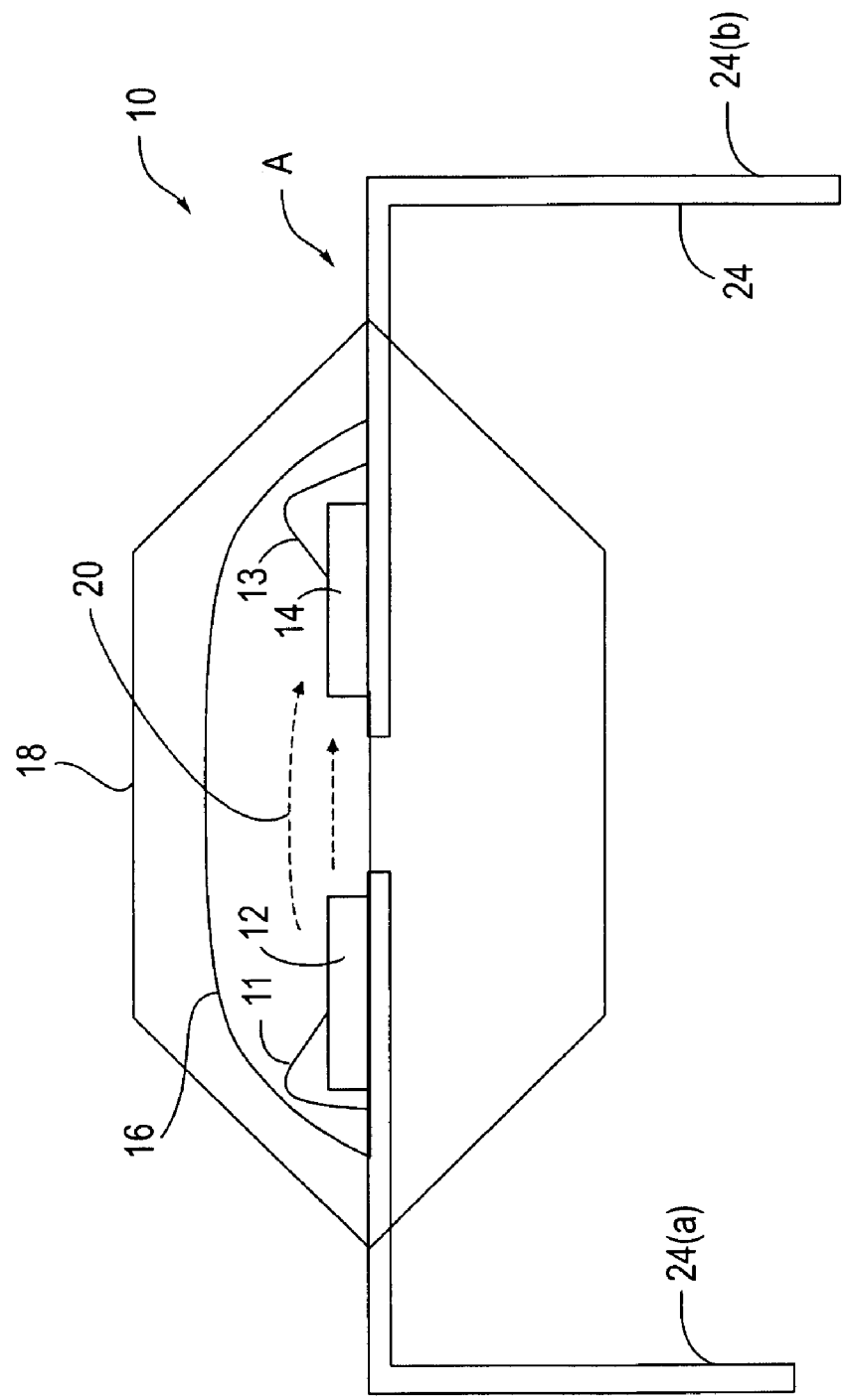
FIG. 1 shows a prior art optocoupler package.
Figure 3:
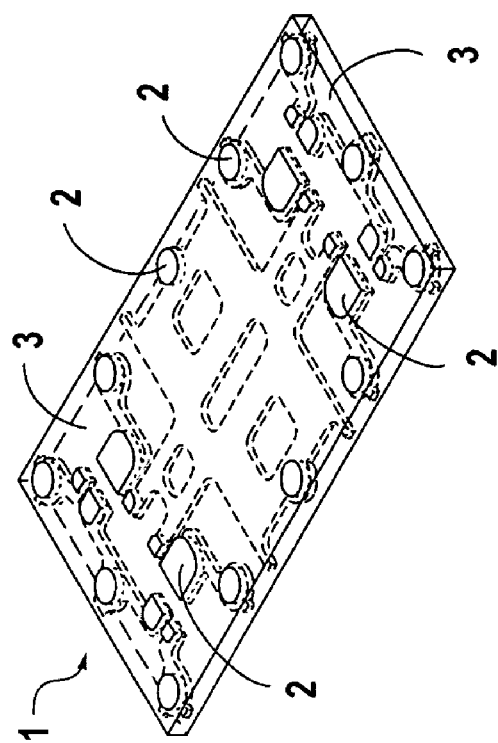
FIG. 3 shows the substrate in FIG. 4 showing the internal leadframe configuration.
Figure 2:
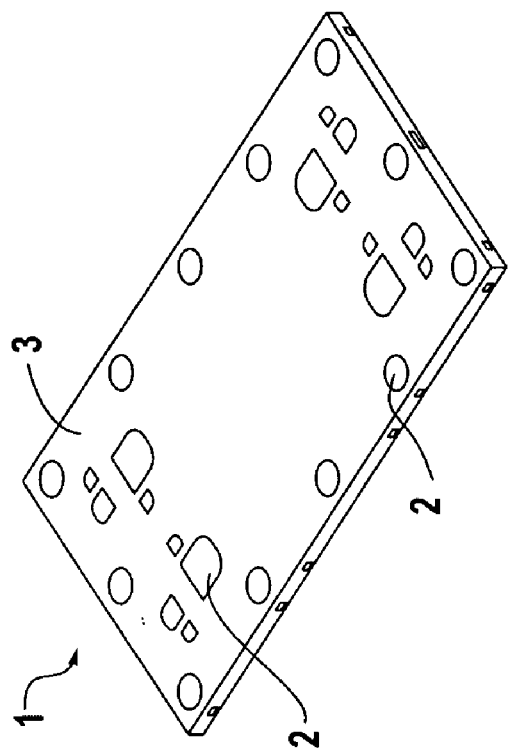
FIG. 2 shows a substrate according to an embodiment of the invention from a bottom perspective view.

FIGS. 2–3 show a pre-molded leadframe substrate 1 that is used in the optocoupler package. It comprises a leadframe 2 and a molding compound 3. The leadframe 2 may include a die attach area where two or more dies including optical receivers and optical emitters are placed. Additional chips such as control chips could also be mounted on the leadframe. Two or more leads may extend from the die attach area and may form terminals of a leadframe. "Leadframe" includes leadframe structures that may or may not have been processed (e.g., by etching). In other cases, other types of substrates could be used.

Figure 4:
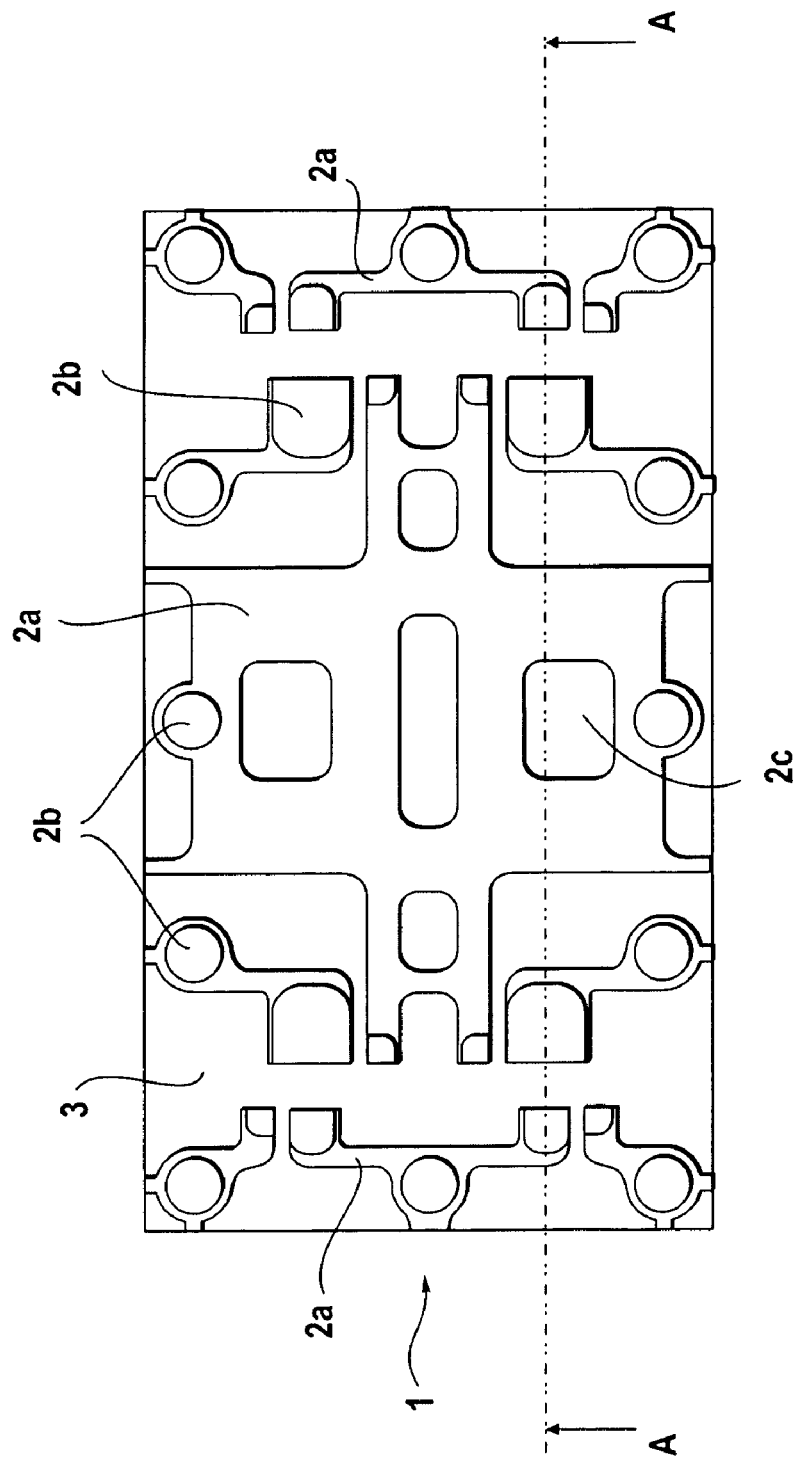
FIG. 4 shows a bottom plan view of the substrate shown in FIG. 5.
Figure 5:
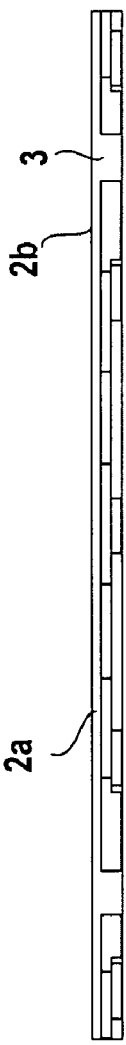
FIG. 5 shows a side cross-sectional view of the substrate shown in FIG. 4 along the line A—A.

Referring to FIGS. 4–5, the leadframe 2 is the skeletal framework of the substrate 1. It has intricate half-etched 2a, non-etched 2b and through-hole or fully etched 2c patterns in it to define functional pads and locking areas (to lock to the molding compound 3) of the substrate 1.

The leadframe 2 can comprise any suitable metal and may be of any suitable thickness. For example, a high mechanical strength copper alloy is preferred. The leadframe 2 can have a thickness of about 0.2 mm (8 mils) or less in the etched or non-etched areas. Etching processes are known to those of ordinary skill in the art. The leadframe 2 may also include plating layers such as Ni, Pd, Au or Ag, etc.

The molding compound 3 of the substrate 1 forms the body of the substrate 1. It fills in the through-hole 2c and half-etched regions 2a of the leadframe 1. In this example, the non-etched regions 2b of the substrate 1 are not covered with the molding compound 3.

The molding compound 3 can comprise a polymeric and/or composite material that may or may not require post mold curing. It may contain epoxy resins, hardeners, elastomers, non-phosphorus flame retardants, lubes, silica fillers, etc. It may have balanced particle sizes in it to ensure complete filling of the half-etched regions of the leadframe 2. It may also contain a sufficient amount of carbon black pigment for better laser marking contrast. The materials making up the balance of the mold compound 3 constituent materials can be used to prevent substrate warpage.

In some embodiments, the substrate 1 can be formed using tape. For example, tape can be attached to the non-etched pads 2b of the leadframe 2, such that the molding compound 3 (or mold bleed or mold flash) does not occupy the functional pads of the substrate 1. The untaped side of the leadframe 2 is overmolded by approximately 0.1 mm in order to add mechanical strength to the substrate 1. In other embodiments, no overmolding is present and the molding compound 3 is only within the interstices of the leadframe 2. The thickness of the substrate 1 can vary depending upon the mechanical and physical requirements of the package 20.

As shown in the Figures, the molding compound 3 in the substrate 1 defines the functional pads. These functional pads are the non-etched regions 2b of the leadframe 2.

Additional substrate forming details can be found in U.S. patent application Ser. No. 10/233,248, filed on Aug. 30, 2002, which is herein incorporated by reference in its entirety.

Figure 6:
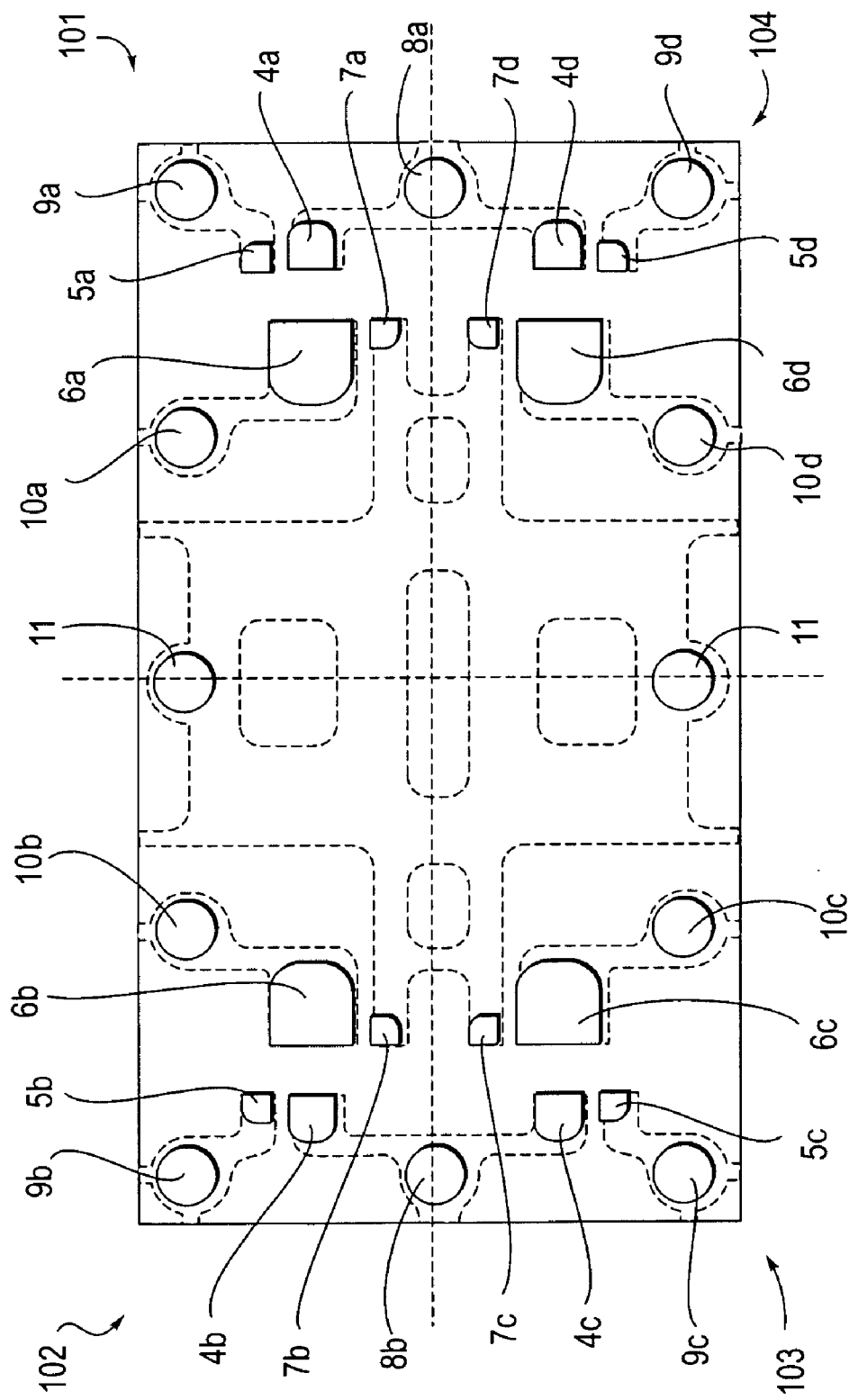
FIG. 6 is another bottom plan view of the substrate illustrating different optocoupler quadrants.

Referring to FIG. 6, the optocoupler package may be divided into four quadrants with four optocouplers, Optocouplers I–IV. Optocoupler I occupies quadrant I (101). Optocoupler II occupies quadrant II (102). Optocoupler III occupies quadrant III (103). Optocoupler IV occupies quadrant IV (104).

Referring to both FIGS. 6–7, the functional pads of the substrate 1 can be labeled as follows:

a) the four inner assembly pads of Optocoupler I 21 are Cathode I (or diode die attach pad I) 4a, Anode I (or diode weld pad I) 5a, Collector I (or phototransistor die attach pad I) 6a and Emitter I (or phototransistor weld pad I) 7a;

b) the four inner assembly pads of Optocoupler II 22 are Cathode II (or diode die attach pad I) 4b, Anode II (or diode weld pad II) 5b, Collector II (or phototransistor die attach pad II) 6b and Emitter II (or phototransistor weld pad II) 7b;

c) the four inner assembly pads of Optocoupler III 23 are Cathode III 4c, Anode III 5c, Collector III 6c and Emitter III 7c; and d) the four inner assembly pads of Optocoupler IV 24 are Cathode IV 4d, Anode IV 5d, Collector IV 6d and Emitter IV 7d.

The non-etched functional pads of the substrate 1 are connected to the terminal pads for peripheral solder ball attachment. These are grouped and routed to make up a symmetrical package substrate 1 with common terminal pads. The peripheral ball attach pads are labeled as follows:

e) cathode or diode die attach pads of Optocouplers I and IV (4a, 4d) are shorted and connected to a common cathode terminal pad 8a and is situated at the outer boundary of quadrants I and IV;

f) cathode or diode die attach weld pads of Optocouplers II and III (4b, 4c) are shorted and connected to a common cathode terminal pad 8b and is situated at the outer boundary of quadrants II and III;

g) each of the anode terminal pads 9a, 9b, 9c, 9d of all optocouplers are situated independently at the peripheral corner of each quadrant;

h) collector terminal pads 10a, 10b, 10c, 10d of each optocoupler are independently and laterally situated directly opposite the anode terminal pads;

i) emitter or phototransistor weld pads 7a, 7b, 7c, 7d of all optocouplers are shorted and routed towards the central horizontal periphery of the substrate resulting in two symmetrical peripheral terminal pads 11 for the emitter solder balls. The anode-cathode pads keep about a 0.5 mm gap with the emitter-collector pads in all optocouplers. This will ensure a high voltage breakdown for each optocoupler.

Figure 7:
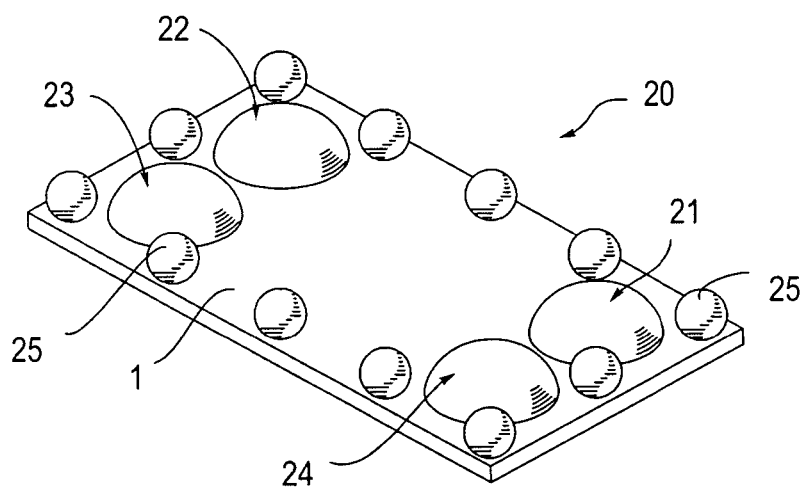
FIG. 7 shows an optocoupler package according to an embodiment of the invention from a bottom perspective view.
Figure 8:
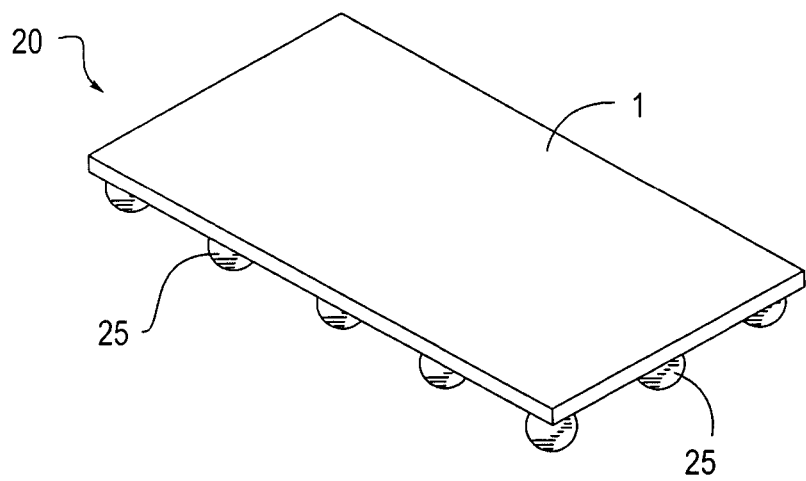
FIG. 8 shows an optocoupler package according to an embodiment of the invention from a top perspective view.

FIG. 7 shows an optocoupler package 20 containing four optocouplers including glob-topped domes 21, 22, 23, 24. The glob top material does not contact the ball attach peripheral terminal pads 8a–8b, 9a–9d, 10a–10d (shown in FIG. 6).

The optocoupler package 20 includes external peripheral solder balls 25 that are attached to the substrate 1. Peripheral balls 25 are attached to terminal pads 8a–8b, 9a–9d, 10a–10d, 11. These balls 25 serve as the immediate connection mechanism for the optocoupler package 20 to a printed circuit board (PCB) 31 (see FIG. 11). The solder balls 25 preferably include Pb-free alloys with high melting temperatures.

As shown in FIG. 7, in the illustrated example, the optocoupler package 20 has 12 equally spaced peripheral solder balls 25. The package peripheral ball out configuration may be changed (based on the same concept of inner assembly pads shorting and terminal routing) depending the specific package pin-out requirements and dies. Although solder balls are described in detail, other conductive structures such as copper columns (e.g., preformed or electroplated) could be used instead. The conductive structures have heights greater than the heights of the optical receivers and the optical emitters in the optical package so that flip chip mounting can take place.

Figure 9:
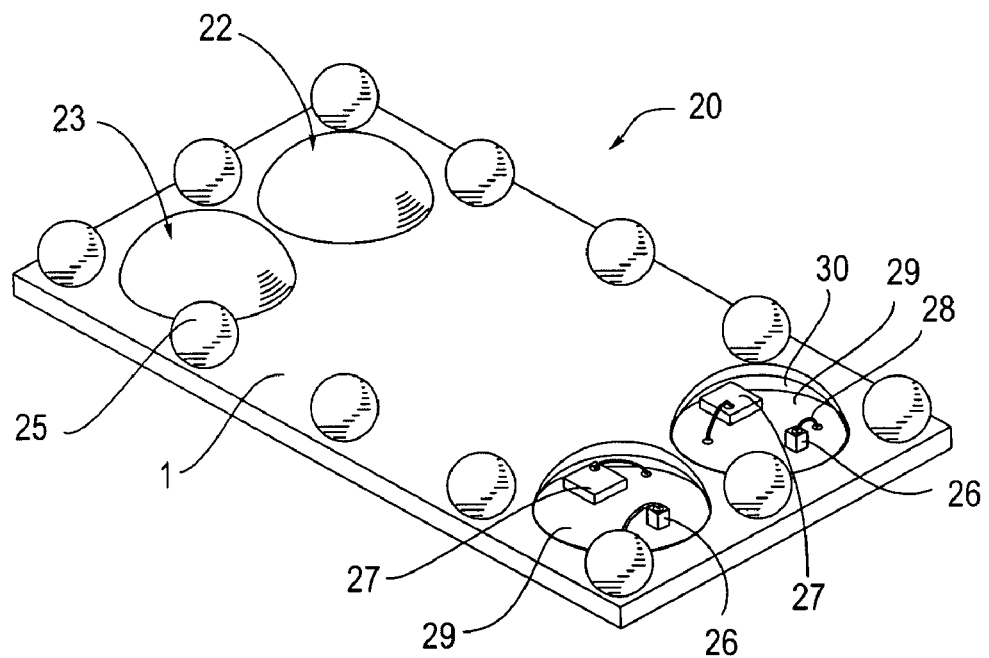
FIG. 9 is a bottom perspective view of an optocoupler package from a bottom perspective view, and where optical emitters and optical receivers are shown.
Figure 10:
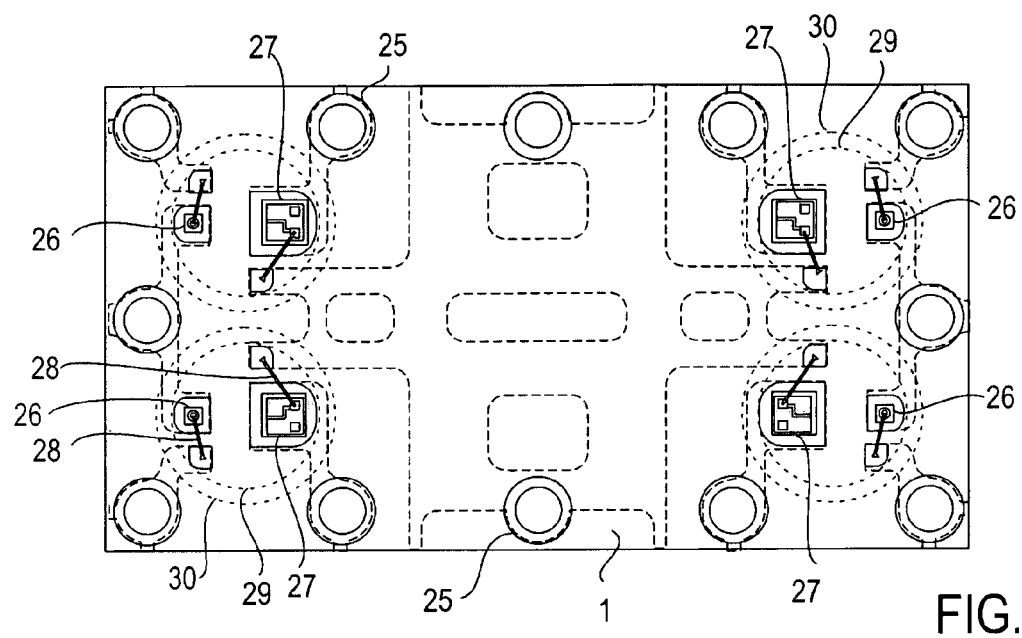
FIG. 10 is a bottom plan view of an optocoupler package showing optical receivers and optical emitters.

Referring to FIGS. 9 and 10, LED die 26 generates photons when a forward current is applied to the optocoupler, resulting to light emissions from the P—N junction in the die 26. An LED die having a height of about 9 mils or below can be used.

Phototransistor die 27 detects light emitted by the LED die 26 and converts it to electrons resulting in current flow at the optocoupler output. Light detection happens at its collector-base junction. A phototransistor die height of about 8 mils or below can be used.

Referring to FIGS. 6, 9, and 10, a die attach material (not shown) bonds the back of each LED die 26 to its designated die attach pad 4a, 4b, 4c, 4d. Similarly, it bonds the back of each phototransistor die 27 to its designated die attach pad 6a, 6b, 6c, 6d. The die attach material can be any conductive bonding material. Examples include Ag-filled epoxies, soft solders, etc. In some embodiments, a die attach fillet can be used and can be controlled at a maximum of about 50% of the die height to maximize light emission from the sides of the LED die 26.

Bonding wires 28 connect the anode pad of the LED dies 26 to the diode weld pads 5a, 5b, 5c, 5d completing the circuitry of the diode components of the package 20. Similarly, they connect the phototransistor dies 27 to their designated weld pads 7a, 7b, 7c, 7d. The bonding wires 28 can comprise any suitable ductile metal—Au, Cu, Al, or doped versions of these metals, alloys of these metals, etc. A wire loop is recommended at approximately 14 mils from the substrate.

The wire bonded LED die and phototransistor die assemblies are coupled together using a light transmissive clear gel material 29. The optical transparency of the coupling gel 29 allows efficient transfer of the light emitted from the LED 26 junction towards the photosensitive junction of the phototransistor 27. The coupling gel 29 covers the entire wire bonded die assemblies and forms a near hemispherical dome for maximum transmission of emitted light.

The light transmissive hemispherical dome 29 of each of the wire bonded LED and phototransistor assemblies is covered with a white reflective glob top material 30 to complete one optocoupler internal package structure. Glob top 30 (or light reflective material) is a light reflective material that keeps the emitted light within the confines of the dome. The glob top coating conforms to the dome shape and can totally cover the clear coupling gel 29 (or light transmissive material). It seals the dome by adhesion. The glob top material 30 can have a minimum thickness of about 0.2 mm.

The optocoupler package can be manufactured according to the following steps.

First, a leadframe molding process can be performed. A leadframe molding process is performed using a taped leadframe as described above. A piece of tape can be attached to the non-etched pads of a leadframe, such that molding compound does not occupy the functional pads of the subsequently formed substrate. The untaped side of the leadframe is overmolded to add mechanical strength to the substrate.

Second, a die attach process can be performed. For example, LED and phototransistor dies can be attached using an adhesive with a conductive filling or solder. Die attach curing may or may not be necessary depending on the type of adhesive used.

Third, a wire bond process can be performed to form conductive paths between the dies and their corresponding pads in the substrate. For example, a thermosonic or ultrasonic wirebonding process can be performed in some embodiments.

Fourth, a dome coat and cure process can be performed. Any suitable liquid dispensing process can be used to dispense the clear coupling gel to form the light transmissive hemispherical dome. Curing may be needed to improve the physical characteristics of coupling gel. Suitable dome coat materials include silicone based materials that are available from Dow Corning and General Electric, although any suitable vendor may be used.

Fifth, a glob top and cure process can be performed. Any suitable liquid dispensing process can be employed for opaque glob topping. Curing may or may not be needed depending on the type of material used. Suitable reflective coating materials include epoxy based coatings with reflective pigments based on materials such as titanium dioxide or other metal oxides. They are commercially available from from Epotek and Hysol, although any suitable vendor may be used.

Sixth, a solder deposit process can be performed (e.g., for solder balls 25 in the Figures). Solder ball attach, fluxing, ball placement or ball shooting, ball jetting and other processes can be employed to attach conductive structures such as solder to the substrate. In other embodiments, conductive columns (e.g., copper columns) could be placed on the substrate instead, or could be electroplated on the substrate.

Seventh, a solder reflow process can be performed (if solder is used). Convection or conduction or radiation solder reflow processes can be used in some embodiments.

Eighth, a singulation process can be performed. Singulation processes include blade sawing, water jet sawing, laser sawing and the like. Singulation processes separate the formed substrates from each other.

Ninth, electrical testing can be performed. High-voltage testing and parametric testing can be used to exclude any packages with electrical defects.

Tenth, a package marking process can be performed. Laser or pad marking or other process can be used to provide package identification and orientation.

Figure 11:
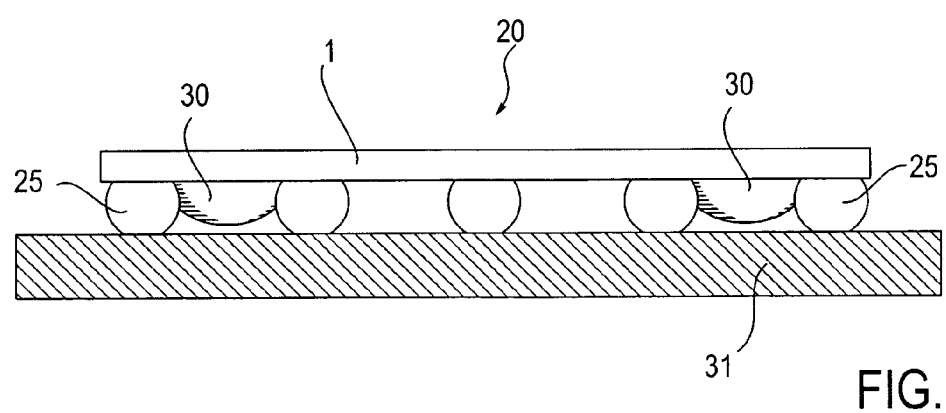
FIG. 11 shows an optocoupler assembly including an optocoupler package mounted on a substrate.

After a package is formed, it can be flipped over and mounted onto a printed circuit board as shown in FIG. 11. Common surface assembly techniques can be used.

It is noted that the above described processes can be performed in the order described above, or they can be performed in a different order.

It is noted that the present invention is not limited to the preferred embodiments described above, and it is apparent that variations and modifications by those skilled in the art can be performed within the spirit and scope of the present invention. Moreover, any one or more embodiment of the invention may be combined with one or more embodiments of the invention without departing from the spirit and scope of the invention.

All U.S. provisional and non-provisional patent applications and publications mentioned above are incorporated by reference in their entirety for all purposes. None is admitted to be prior art.

What is claimed is:

1. An optocoupler package comprising:
   (a) a substrate comprising a leadframe and a molding compound;
   (b) an optical emitter;
   (c) an optical receiver, wherein the optical emitter and the optical receiver are electrically coupled to the leadframe; and
   (d) an optically transmissive medium disposed between the optical emitter and optical receiver, and wherein the optocoupler package further comprises a plurality of conductive structures coupled to the leadframe, wherein the conductive structures have heights greater than the heights of the optical receiver and the optical emitter, and wherein the conductive structures are solder structures.

2. The optocoupler package of claim 1 further comprising bond wires electrically coupling the optical receiver to the leadframe and electrically coupling the optical emitter to the leadframe.

3. The optocoupler package of claim 1 wherein the leadframe includes etched portions and non-etched portions, and wherein the etched portions are covered by the molding compound and the non-etched portions are not covered by the molding compound.

4. The optocoupler package of claim 1 wherein the leadframe comprises copper.

5. The optocoupler package of claim 1 wherein a plurality of optocouplers are on the substrate.

6. The optocoupler package of claim 1 wherein the leadframe includes etched portions and non-etched portions at a first side, and wherein the etched portions are covered by the molding compound and the non-etched portions are not covered by the molding compound, and wherein the molding compound completely covers the second side of the leadframe.

7. The optocoupler package of claim 1 further comprising a chip including a MOSFET on the substrate.

8. The optocoupler package of claim 1 wherein the solder structures are solder balls.

9. A method comprising:
   (a) forming a substrate comprising a leadframe and a molding compound, wherein exterior surfaces of the leadframe and the molding compound are coplanar;
   (b) attaching an optical emitter and an optical receiver to the substrate; and
   (c) depositing a light transmissive material between the optical emitter and the optical receiver to form an optocoupler package,
   wherein the optocoupler package is thereafter configured to be flipped over and mounted to a circuit board.

10. The method of claim 9 wherein the method comprises, prior to (a), etching the leadframe.

11. The method of claim 9 wherein the leadframe comprises copper.

12. The method of claim 9 further comprising attaching wires from the optical emitter and the optical receiver to the leadframe.

13. The method of claim 9 further comprising depositing an opaque material on the light transmissive material.

14. The method of claim 9 further comprising attaching at least four optical emitters and at least four optical receivers on the substrate.

15. The method of claim 9 further comprising flipping the optocoupler package over and mounting the optocoupler package to a circuit board.

16. A method comprising:
   (a) forming a substrate comprising a leadframe and a molding compound;
   (b) attaching an optical emitter and an optical receiver to the substrate; and
   (c) depositing a light transmissive material between the optical emitter and the optical receiver to form an optocoupler package,
   wherein the optocoupler package is thereafter configured to be flipped over and mounted to a circuit board, and wherein the method further comprises forming a plurality of conductive structures on the substrate, wherein the conductive structures have heights greater than the heights of the optical emitter and optical receiver.

17. An optocoupler package comprising:
   (a) a substrate comprising a molding material and a leadframe, wherein exterior surfaces of the molding material and the leadframe are coplanar;
   (b) at least two optical emitters;
   (c) at least two optical receivers;
   (d) optically transmissive media between adjacent optical emitters and optical receivers; and
   (e) a light reflective material on the optically transmissive media,
   wherein the optical emitters and the optical receivers are on the substrate.

18. The optocoupler package of claim 17 wherein the leadframe includes etched portions.

19. The optocoupler package of claim 16 wherein the leadframe includes copper.

20. The optocoupler package of claim 17 further comprising a chip including a MOSFET on the substrate.

21. An optocoupler package comprising:
   (a) a substrate comprising a leadframe including half-etched regions and non-etched regions and a molding compound, wherein the molding compound covers the half-etched regions and exposes the non-etched regions, an exterior surface of the molding compound and the non-etched regions forming a planar surface;
   (b) an optical emitter mounted on at least some of the non-etched regions;
   (c) an optical receiver mounted on at least some of the non-etched regions, wherein the optical emitter and the optical receiver are electrically coupled to the leadframe; and
   (d) an optically transmissive medium disposed between the optical emitter and optical receiver and being on the substrate.

22. The optocoupler package of claim 21 wherein the leadframe structure includes plating layers and comprises copper.

23. The optocoupler package of claim 21 wherein at least two optical emitters are on at least some of the non-etched regions and at least two optical receivers are mounted on at least some of the non-etched regions.

24. The optocoupler package of claim 21 further comprising a plurality of solder structures mounted on the periphery of the substrate and encircling the optical receiver and the optical emitter.

25. An electrical assembly comprising:
   an optocoupler package comprising
      a substrate comprising a leadframe including etched regions and non-etched regions and a molding compound, wherein the molding compound covers the etched regions and exposes the non-etched regions, an exterior surface of the molding compound and the non-etched regions forming a planar surface;
   an optical emitter mounted on at least some of the non-etched regions;
   an optical receiver mounted on at least some of the non-etched regions, wherein the optical emitter and the optical receiver are electrically coupled to the leadframe; and
   an optically transmissive medium disposed between the optical emitter and optical receiver and being on the substrate; and
   a printed circuit board, wherein the optical emitter and the optical receiver are disposed between the substrate and the printed circuit board.

26. The optocoupler package of claim 25 further comprising a plurality of solder balls disposed between the substrate and the circuit board and electrically connecting the substrate and the circuit board.

27. A method comprising:
   (a) forming a substrate comprising a leadframe and a molding compound;
   (b) attaching an optical emitter and an optical receiver to the substrate; and
   (c) depositing a light transmissive material between the optical emitter and the optical receiver to form an optocoupler package,
   wherein the optocoupler package is thereafter configured to be flipped over and mounted to a circuit board, and wherein the method further comprises forming a plurality of conductive structures on the substrate, wherein the conductive structures have heights greater than the heights of the optical emitter and optical receiver, wherein the conductive structures are solder balls.

* * * * *